US008380151B2

(12) United States Patent
Swarts et al.

(10) Patent No.: US 8,380,151 B2
(45) Date of Patent: Feb. 19, 2013

(54) METHOD AND SYSTEM FOR REDUCING THE COMPLEXITY OF MULTI-FREQUENCY HYPOTHESIS TESTING USING AN ITERATIVE APPROACH (75) Inventors: Francis Swarts, San Diego, CA (US); Mark Kent, Vista, CA (US)

(73) Assignee: Broadcom Corporation, Irvine, CA (US)

( * ) Notice: Subject to any disclaimer, the term of this patent is extended or adjusted under 35 U.S.C. 154(b) by 210 days.

(21) Appl. No.: 12/721,979

(22) Filed: Mar. 11, 2010

(65) Prior Publication Data

US 2011/0151817 A1 Jun. 23, 2011

Related U.S. Application Data (60) Provisional application No. 61/288,053, filed on Dec. 18, 2009.

(51) Int. Cl.
H04B 1/00 (2006.01)
(52) U.S. Cl. .......................... 455/255; 455/259; 375/344
(58) Field of Classification Search .................. 455/130, 455/201, 205, 255, 256, 257, 260, 264, 265, 455/310, 259; 375/150, 344, 347, 348, 349
See application file for complete search history.

(56) References Cited

U.S. PATENT DOCUMENTS

| | | | | |
|---|---|---|---|---|
| 8,059,767 B2 * | 11/2011 | Furman et al. | ................ | 375/344 |
| 2002/0054624 A1 * | 5/2002 | Boloorian | .................... | 375/150 |
| 2003/0012268 A1 | 1/2003 | Doetsch et al. | | |
| 2003/0099206 A1 | 5/2003 | Jones et al. | | |
| 2004/0062298 A1 | 4/2004 | McDonough et al. | | |
| 2005/0238087 A1 | 10/2005 | Yang et al. | | |
| 2007/0218854 A1 * | 9/2007 | Lawrence et al. | ............. | 455/310 |
| 2008/0019350 A1 | 1/2008 | Onggosanusi et al. | | |
| 2008/0090600 A1 | 4/2008 | Demir et al. | | |
| 2009/0017768 A1 | 1/2009 | Makarov | | |
| 2009/0034501 A1 | 2/2009 | Hahm et al. | | |
| 2009/0034589 A1 | 2/2009 | Hahm et al. | | |
| 2009/0041162 A1 | 2/2009 | Li et al. | | |
| 2009/0086713 A1 | 4/2009 | Luo | | |
| 2009/0219883 A1 | 9/2009 | Cho et al. | | |
| 2010/0098031 A1 | 4/2010 | Charbit | | |
| 2010/0128824 A1 * | 5/2010 | Hui | ............................... | 375/344 |
| 2010/0158079 A1 | 6/2010 | Li et al. | | |
| 2010/0182979 A1 | 7/2010 | Malladi et al. | | |
| 2011/0026413 A1 | 2/2011 | Swarts et al. | | |
| 2011/0026648 A1 | 2/2011 | Swarts et al. | | |
| 2011/0026649 A1 | 2/2011 | Lipka et al. | | |
| 2011/0223901 A1 | 9/2011 | Swarts et al. | | |

* cited by examiner

*Primary Examiner* — Thanh Le
(74) *Attorney, Agent, or Firm* — Sterne, Kessler, Goldstein & Fox PLLC (57) ABSTRACT Aspects of a method and system for reducing the complexity of multi-frequency hypothesis testing using an iterative approach may include estimating a frequency offset of a received signal via a plurality of iterative frequency offset hypotheses tests. The iterative frequency offset hypotheses may be adjusted for each iteration. A correlation may be done between a primary synchronization signal (PSS), and one or more frequency offset versions of a received signal to control the adjustment of the iterative frequency offset hypotheses. A frequency of the received local oscillator signal may be adjusted based on the estimated frequency offset. One or more frequency offset version of the received signal may be generated via one or more multiplication, and the multiplication may be achieved via a multiplication signal corresponding to one or more frequency offsets. The frequency offset of the received signal may be estimated via the correlation.

19 Claims, 7 Drawing Sheets

METHOD AND SYSTEM FOR REDUCING THE COMPLEXITY OF MULTI-FREQUENCY HYPOTHESIS TESTING USING AN ITERATIVE APPROACH

CROSS-REFERENCE TO RELATED APPLICATIONS/INCORPORATION BY REFERENCE

This application makes reference to, claims priority to, and claims the benefit of U.S. Provisional Application Ser. No. 61/288,053, filed on Dec. 18, 2009.

The above mentioned application is hereby incorporated herein by reference in its entirety.

FIELD OF THE INVENTION

Certain embodiments of the invention relate to signal processing for communication systems. More specifically, certain embodiments of the invention relate to a method and system for reducing the complexity of multi-frequency hypothesis testing using an iterative approach.

BACKGROUND OF THE INVENTION

Mobile communication has changed the way people communicate and mobile phones have been transformed from a luxury item to an essential part of every day life. Nowadays, the use of mobile phones is dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

Third (3G) and fourth generation (4G) cellular networks have been specifically designed to fulfill these future demands of the mobile Internet. As these services grow in popularity and usage, factors such as cost efficient optimization of network capacity and quality of service (QoS) will become even more essential to cellular operators than it is today. These factors may be achieved with careful network planning and operation, improvements in transmission methods, and advances in receiver techniques. To this end, carriers need technologies that will allow them to increase throughput and, in turn, offer advanced QoS capabilities and speeds that rival those delivered by cable modem and/or DSL service providers. Recently, advances in multiple antenna technology and other physical layer technologies have started to significantly increase available communication data rates.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and/or system for reducing the complexity of multi-frequency hypothesis testing using an iterative approach, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for reducing the complexity of multi-frequency hypothesis testing using an iterative approach. Aspects of the method and system for reducing the complexity of multi-frequency hypothesis testing using an iterative approach may comprise estimating a frequency offset of a receiver local oscillator signal via a plurality of iterative frequency offset hypotheses tests. The iterative frequency offset hypotheses may be adjusted for each iteration. A correlation may be done between a primary synchronization signal (PSS), and one or more frequency offset versions of a received signal to control the adjustment of the iterative frequency offset hypotheses. A frequency of the received local oscillator signal may be adjusted based on the estimated frequency offset.

One or more frequency offset versions of the received signal may be generated via one or more multiplication operations, and the multiplication operations may be achieved via a multiplication signal corresponding to one or more frequency offsets. The frequency offset of the receiver local oscillator signal may be estimated via the PSS correlation process. The frequency offset of the receiver local oscillator signal may be estimated by comparing the correlation results between the primary synchronization signal and the one or more frequency offset versions of the received signal. The frequency offset range for each iteration may be adjusted for the frequency offset hypotheses by a factor equal to the number of the frequency offset hypotheses. One or more offset frequencies for generating the one or more frequency offset versions of the received signal may be selected by choosing the one or more offset frequencies to be a center frequency of a frequency offset range associated with the frequency offset hypotheses. The primary synchronization signal may be compliant with one or more standards, for example, the E-UTRA (LTE) or UMTS standard. The received signal may be received via multiple antennas, and the correlated signals may be combined with one or more correlated signals associated with one or more of the multiple antennas.

Figure 1A:
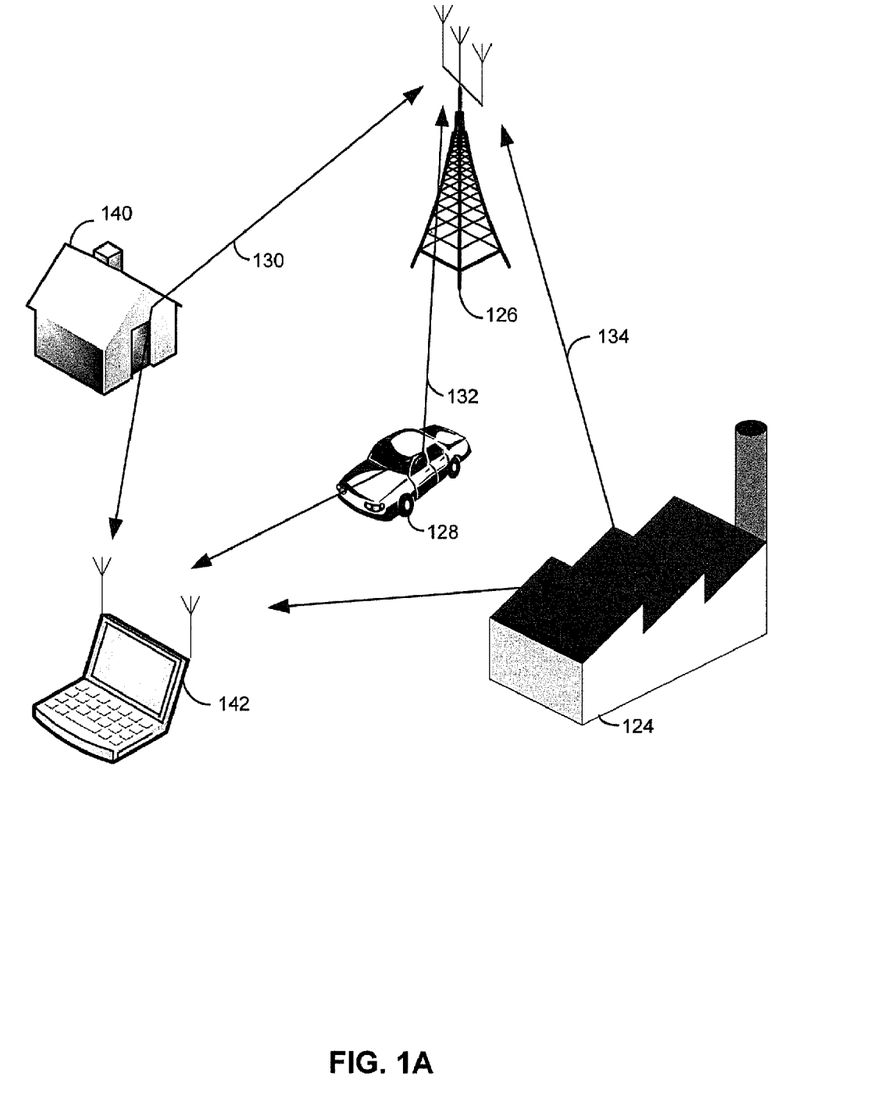
FIG. 1A is a diagram illustrating exemplary cellular multipath communication between a base station and a mobile computing terminal, in connection with an embodiment of the invention.

FIG. 1A is a diagram illustrating exemplary cellular multipath communication between a base station and a mobile computing terminal, in connection with an embodiment of the invention. Referring to FIG. 1A, there is shown a building 140 such as a home or office, a mobile terminal 142, a factory 124, a base station 126, a car 128, and communication paths 130, 132 and 134.

The base station 126 and the mobile terminal 142 may comprise suitable logic, circuitry and/or code that may be enabled to generate and process MIMO communication signals.

Communication between the base station 126 and the mobile terminal 142 may take place over a wireless channel. The wireless channel may comprise a plurality of communication paths, for example, the communication paths 130, 132 and 134. The wireless channel may change dynamically as the mobile terminal 142 and/or the car 128 moves. In some cases, the mobile terminal 142 may be in line-of-sight (LOS) of the base station 126. In other instances, there may not be a direct line-of-sight between the mobile terminal 142 and the base station 126 and the radio signals may travel as reflected communication paths between the communicating entities, as illustrated by the exemplary communication paths 130, 132 and 134. The radio signals may be reflected by man-made structures like the building 140, the factory 124 or the car 128, or by natural obstacles like hills. Such a system may be referred to as a non-line-of-sight (NLOS) communications system.

Signals communicated by the communication system may comprise both LOS and NLOS signal components. If a LOS signal component is present, it may be much stronger than NLOS signal components. In some communication systems, the NLOS signal components may create interference and reduce the receiver performance. This may be referred to as multipath interference. The communication paths 130, 132 and 134, for example, may arrive with different delays at the mobile terminal 142. The communication paths 130, 132 and 134 may also be differently attenuated. In the downlink, for example, the received signal at the mobile terminal 142 may be the sum of differently attenuated communication paths 130, 132 and/or 134 that may not be synchronized and that may dynamically change. Such a channel may be referred to as a fading multipath channel. A fading multipath channel may introduce interference but it may also introduce diversity and degrees of freedom into the wireless channel. Communication systems with multiple antennas at the base station and/or at the mobile terminal, for example MIMO systems, may be particularly suited to exploit the characteristics of wireless channels and may extract large performance gains from a fading multipath channel that may result in significantly increased performance with respect to a communication system with a single antenna at the base station 126 and at the mobile terminal 142, in particular for NLOS communication systems. Furthermore Orthogonal Frequency Division Multiplexing (OFDM) systems may be suitable for wireless systems with multipath. To enable a communication receiver to decode data, and to deal with multipath propagation, for example via interference cancellation protocols, timing may be established with respect to the received signal, in particular frame timing, and slot timing.

To enhance performance, the receivers at the base station 126 or the mobile terminal 142 may be operable to estimate one or more operation parameters related to decoding of the transmitted messages. Exemplary parameters may comprise one or more wireless channel characteristics, for one or more multipath components, for example multi-path communication paths 130, 132 and 134. Due to the wireless environment, and/or inaccuracies at the receiver, the local oscillator frequency of the receiver may be offset from the desired local oscillator frequency, which may be estimated.

Figure 1B:
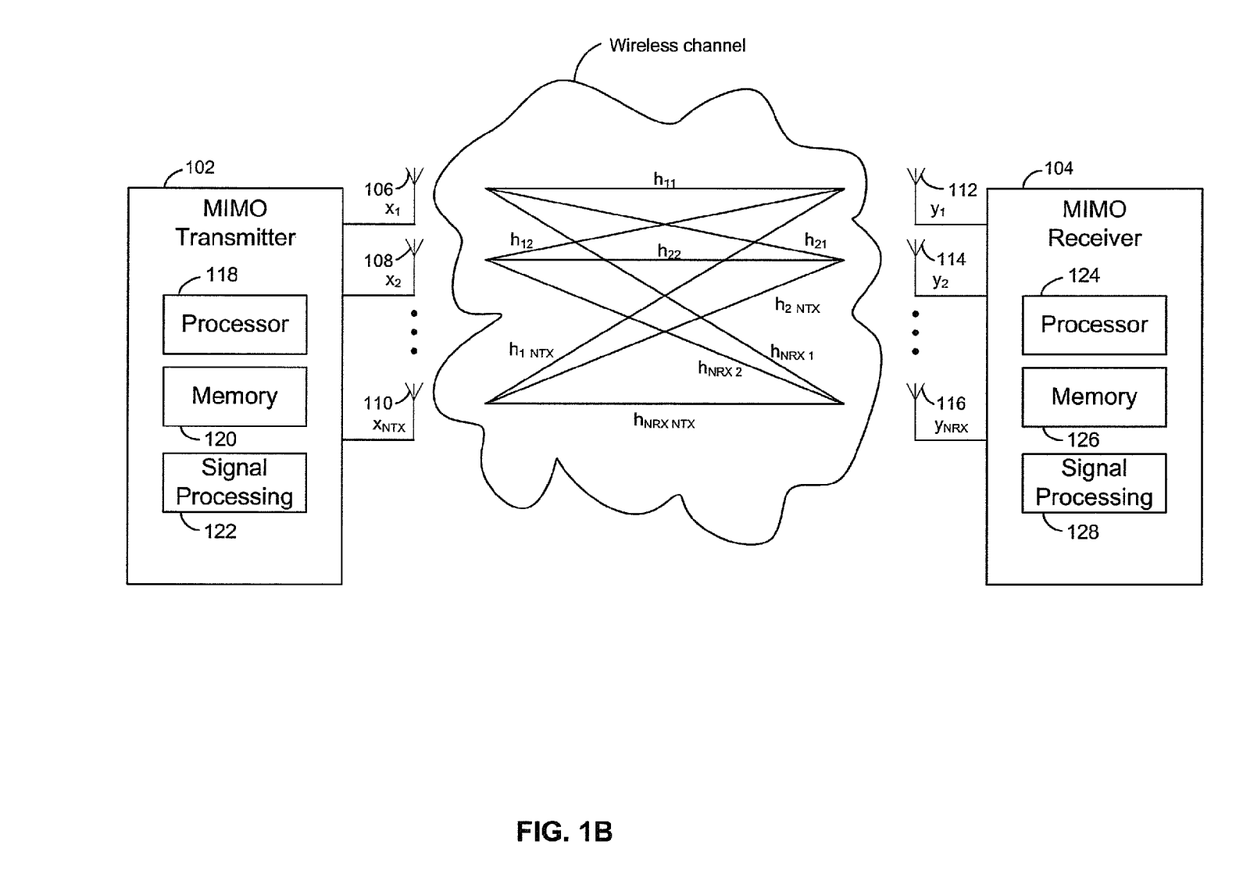
FIG. 1B is a diagram illustrating an exemplary MIMO communication system, in accordance with an embodiment of the invention.

FIG. 1B is a diagram illustrating an exemplary MIMO communication system, in accordance with an embodiment of the invention. Referring to FIG. 1B, there is shown a MIMO transmitter 102 and a MIMO receiver 104, and antennas 106, 108, 110, 112, 114 and 116. The MIMO transmitter 102 may comprise a processor module 118, a memory module 120, and a signal processing module 122. The MIMO receiver 104 may comprise a processor module 124, a memory module 126, and a signal processing module 128. There is also shown a wireless channel comprising communication paths $h_{11}$, $h_{12}$, $h_{22}$, $h_{21}$, $h_{2\,NTX}$, $h_{1\,NTX}$, $h_{NRX1}$, $h_{NRX2}$, $h_{NRX NTX}$, where $h_{mn}$ may represent a channel coefficient from transmit antenna n to receiver antenna m. There may be $N_{TX}$ transmitter antennas and $N_{RX}$ receiver antennas. There is also shown transmit symbols $x_1$, $x_2$ and $x_{NTX}$, and receive symbols $y_1$, $y_2$ and $y_{NRX}$.

The MIMO transmitter 102 may comprise suitable logic, circuitry and/or code that may be enabled to generate transmit symbols $x_i$ i∈{1, 2, ... $N_{TX}$} that may be transmitted by the transmit antennas, of which the antennas 106, 108 and 110 may be depicted in FIG. 1B. The processor module 118 may comprise suitable logic, circuitry, and/or code that may be enabled to process signals. The memory module 120 may comprise suitable logic, circuitry, and/or code that may be enabled to store and/or retrieve information for processing in the MIMO transmitter 102. The signal processing module 122 may comprise suitable logic, circuitry and/or code that may be enabled to process signals, for example in accordance with one or more MIMO transmission protocols. The MIMO receiver 104 may comprise suitable logic, circuitry and/or code that may be enabled to process the receive symbols $y_i$ i∈{1, 2, ... $N_{RX}$} that may be received by the receive antennas, of which the antennas 112, 114 and 116 may be shown in FIG. 1B. The processor module 124 may comprise suitable logic, circuitry, and/or code that may be enabled to process signals. The memory module 126 may comprise suitable logic, circuitry, and/or code that may be enabled to store and/or retrieve information for processing in the MIMO receiver 104. The signal processing module 128 may comprise suitable logic, circuitry and/or code that may be enabled to process signals, for example in accordance with one or more MIMO protocols. An input-output relationship between the transmitted and the received signal in a MIMO system may be specified as:

$$y = Hx + n$$

where $y=[y_1, y_2, \ldots y_{NRX}]^T$ may be a column vector with $N_{RX}$ elements, $.^T$ may denote a vector transpose, $H[h_{ij}]$:i∈{1, 2, ... $N_{RX}$}; j∈{1, 2, ... $N_{TX}$} may be a channel matrix of dimensions $N_{RX}$ by $N_{TX}$, $x=[x_1, x_2, \ldots x_{NTX}]^T$ is a column vector with $N_{RX}$ elements and n is a column vector of noise samples with $N_{RX}$ elements.

The system diagram in FIG. 1B may illustrate an exemplary multi-antenna system as it may be utilized in a Universal Mobile Telecommunication System (UMTS) Evolved Universal Terrestrial Radio Access (EUTRA) or Long-Term Evolution (LTE) system. Over each of the $N_{TX}$ transmit antennas, a symbol stream, for example $x_1(t)$ over antenna 106, may be transmitted. A symbol stream, for example $x_1(t)$, may comprise one or more symbols, wherein each symbol may be modulated onto a different sub-carrier. OFDM systems may generally use a relatively large number of subcarriers in parallel, for each symbol stream. For example, a symbol stream $x_1(t)$ may comprise symbols on carriers $f_m$: $m \in \{1, 2, \ldots M\}$, and M may be a subset of the FFT size that may be utilized at the receiver. For instance, with FFT sizes of N, N>M and may create guard-tones that may allow utilization of variable bandwidth when deployed, for example, 64, 128, or 512 sub-carriers. The M sub-carriers may comprise a symbol stream $x_1(t)$, for example, that may occupy a bandwidth of a few kilohertz to a few megahertz.

Common bandwidth may be between 1 MHz and up to 100 MHz, for example. Thus, each symbol stream may comprise one or more sub-carriers, and for each sub-carrier a wireless channel may comprise multiple transmission paths. For example, a wireless channel $h_{12}$ from transmit antenna 108 to receive antenna 112, as illustrated in the figure, may be multi-dimensional. In particular, the wireless channel $h_{12}$ may comprise a temporal impulse response, comprising one or more multipath components. Furthermore, a frequency offset from a target transmission frequency may be associated with a wireless channel $h_{jk}$, and may often be due to channel or receiver effects. The wireless channel $h_{12}$ may also comprise a different temporal impulse response for each sub-carrier $f_m$ of the symbol stream, for example $x_2(t)$. The wireless channels as illustrated in FIG. 1B depicts a spatial dimension of the wireless channel because the transmitted signal from each transmit antenna may be received differently at each receiver antenna. Thus, a channel impulse response may be measured and/or estimated for each sub-carrier.

To enable decoding of data, and channel estimation, frame timing may be acquired in accordance with various embodiments of the invention. The transmission of small transmission entities, for example bits, may be arranged into larger units consisting of several consecutive bits, and/or symbols. These larger units may be slots, and multiple consecutive slots may be referred to as a frame. To enable data reception, both slot and frame timing may be determined at the receiver. The receiver may be operable to determine the frequency offset from the transmission frequency, associated with the receiver local oscillator frequency for the wireless channel. The frequency offset may be estimated via an iterative multi-hypotheses test, which may be achieved through correlation of the received signals and the primary synchronization signal (PSS), in accordance with various embodiments of the invention.

Figure 2:
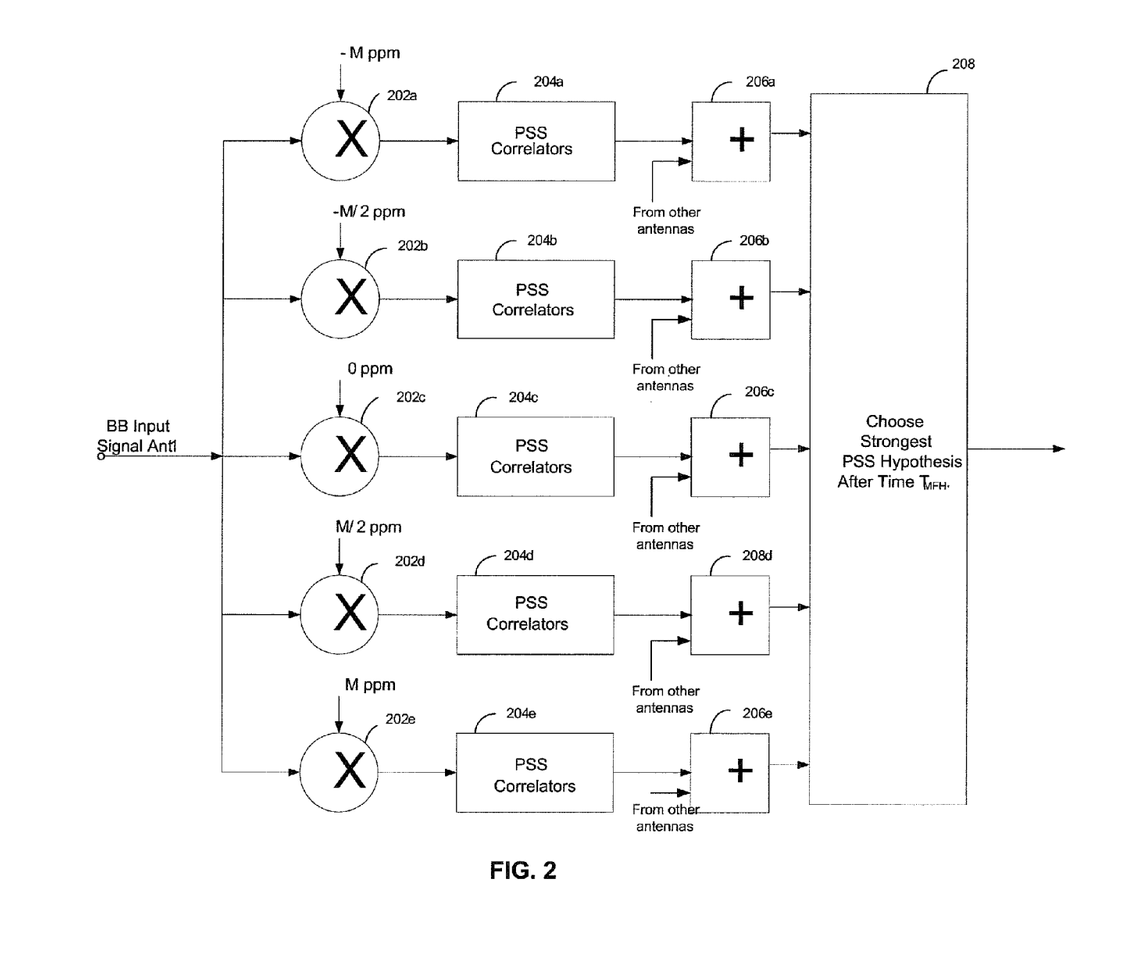
FIG. 2 is a diagram illustrating an exemplary multi-hypothesis structure for frequency offset estimation, in connection with various embodiments of the invention.

FIG. 2 is a diagram illustrating an exemplary multi-hypotheses structure for frequency offset estimation, in connection with various embodiments of the invention. Referring to FIG. 2, there is shown multipliers 202a, 202b, 202c, 202d, and 202e, Primary Synchronization Signal (PSS) correlators 204a, 204b, 204c, 204d, and 204e, adders 206a, 206b, 206c, 206d, and 206e, and selection block 208. There is also shown a baseband (BB) signal input from a first antenna, and a plurality of input signals from similar multi-hypotheses structures from possible other antennas, in the case of a multi-antenna system.

The multipliers 202a, 202b, 202c, 202d, and 202e may comprise suitable logic, circuitry, interfaces and/or code that may be operable to multiply a plurality of input signals, and generate an output signal that may be proportional to the product of the plurality of input signals. The PSS correlators 204a, 204b, 204c, 204d, and 204e may comprise suitable logic, circuitry, interfaces and/or code that may be operable to generate an output signal that may be a correlation between one or more input signals and one or more primary synchronization signals. The adders 206a, 206b, 206c, 206d, and 206e may comprise suitable logic, circuitry, interfaces and/or code that may be operable to generate an output signal that may be proportional to the sum of a plurality of input signals. The selection block 208 may comprise suitable logic, circuitry, interfaces and/or code that may be operable to generate an output signal that may correspond to one of a plurality of input signals, based on a decision metric computed from the plurality of input signals.

To estimate a frequency offset of a receiver local oscillator signal from a target frequency, the frequency offset may be estimated through a plurality of hypothesis tests for a plurality of frequency offsets, as illustrated in FIG. 2. For example, for a received baseband signal from an exemplary antenna 1, a BB input signal ant 1, it may be desirable to estimate a frequency offset. In this regard, the BB input signal ant 1, may be communicatively coupled to a plurality of multipliers, of which an exemplary embodiment with multipliers 202a, 202b, 202c, 202d, and 202e is illustrated. At the multiplier 202a, the BB input signal ant 1 may be offset in frequency by a certain offset −M Hz, through suitable multiplication with an offset signal. For example, if the BB input signal ant 1 may be at frequency (x+d), where x may be a desired frequency without offset, and d may be the actual offset from frequency x in the signal BB input ant 1, the output signal of multiplier 202a may be at a frequency (x+d−M). Similarly, the outputs of multipliers 202b, 202c, 202d and 202e may be at frequencies (x+d−M/2), (x+d), (x+d+M/2), (x+d+M), respectively. Thus, the multipliers 202a, 202b, 202c, 202d, and 202e may apply a set of offset frequencies to an input signal. For signals received at baseband, the desired frequency x may typically be x=0.

The outputs of the multipliers 202b, 202c, 202d and 202e may be communicatively coupled to the PSS correlators 204a, 204b, 204c, 204d, and 204e, respectively. At the PSS correlator 204a, for example, the output signal from the multiplier 202a may be, correlated with a primary synchronization signal (PSS). Typically, a higher correlation magnitude between a PSS signal and the output signal of the multiplier 202a may indicate a lower offset between actual and desired local oscillator frequency at the receiver, which may be manifested by the output of the multiplier 202a. The PSS may be a reference signal at baseband. Thus, in accordance with various embodiments of the invention, a higher correlation output magnitude of a PSS correlator 204a may correspond to a small difference in frequency between an output signal of the multiplier 202a at frequency (d−M) and a reference PSS signal at baseband. Hence, a high correlation value may indicate that a certain offset M may compensate a certain offset d relatively well, that is, in the above example, d-M may be small. Similarly, the PSS correlators 204b, 204c, 204d, and 204e may compare a reference PSS signal at baseband, with the correspondingly offset output of the multipliers 202b, 202c, 202d, and 204e, respectively.

In instances where multiple antenna systems may be utilized, for example in a MIMO system, the received baseband signals from each antenna may be processed similarly. For example, a second antenna signal, a BB input signal ant 2, may be offset in a multiplier similar to the multiplier 202a, and correlated with a PSS reference signal in a PSS correlator similar to the PSS correlator 204a. In these instances, the plurality of PSS correlator outputs corresponding to an offset for one or more antennas may be combined by the adders 206a, 206b, 206c, 206d, and 206e. For example, the PSS correlator outputs from at least a second antenna may be combined with the PSS correlator 204a output for an offset −M, in the adder 206a, as illustrated in FIG. 2.

To determine, the most appropriate frequency offset estimate, the selector block 208 may choose between the outputs of the adders 206a, 206b, 206c, 206d, and 206e, for example by choosing the frequency hypothesis test corresponding to the largest correlation value. That is, the selector block 208 may typically choose the output of the adders 206a, 206b, 206c, 206d, and 206e corresponding to the smallest difference |d+s|, where, for example, $$s \in \left\{-M, -\frac{M}{2}, 0, \frac{M}{2}, M\right\},$$

as illustrated in accordance with various embodiments in FIG. 2. The output of the selector block 208 may indicate which output of the adders 206a, 206b, 206c, 206d, and 206e may have been selected, and thus provides a frequency offset estimate through the corresponding frequency offset applied in the multiplier associated with the selected adder output.

When the frequency offset d is limited to a certain finite range of frequencies, the resolution of the hypothesis testing as illustrated in FIG. 2 may depend on the number of different hypotheses that may be tested. As illustrated in FIG. 2, an exemplary 5 hypotheses may be tested. Similarly, a higher accuracy may be obtained, for example, by using 9 hypothesis tests, whereby the difference |d+s|, may be computed from an exemplary set of offsets $$s \in \left\{-M, -\frac{3M}{4}, -\frac{M}{2}, -\frac{M}{4}, 0, \frac{M}{4}, \frac{M}{2}, \frac{3M}{4}, M\right\}.$$

The increased accuracy may lead to an increase in hypothesis testing hardware, similar to the one illustrated in FIG. 2.

Figure 3A:
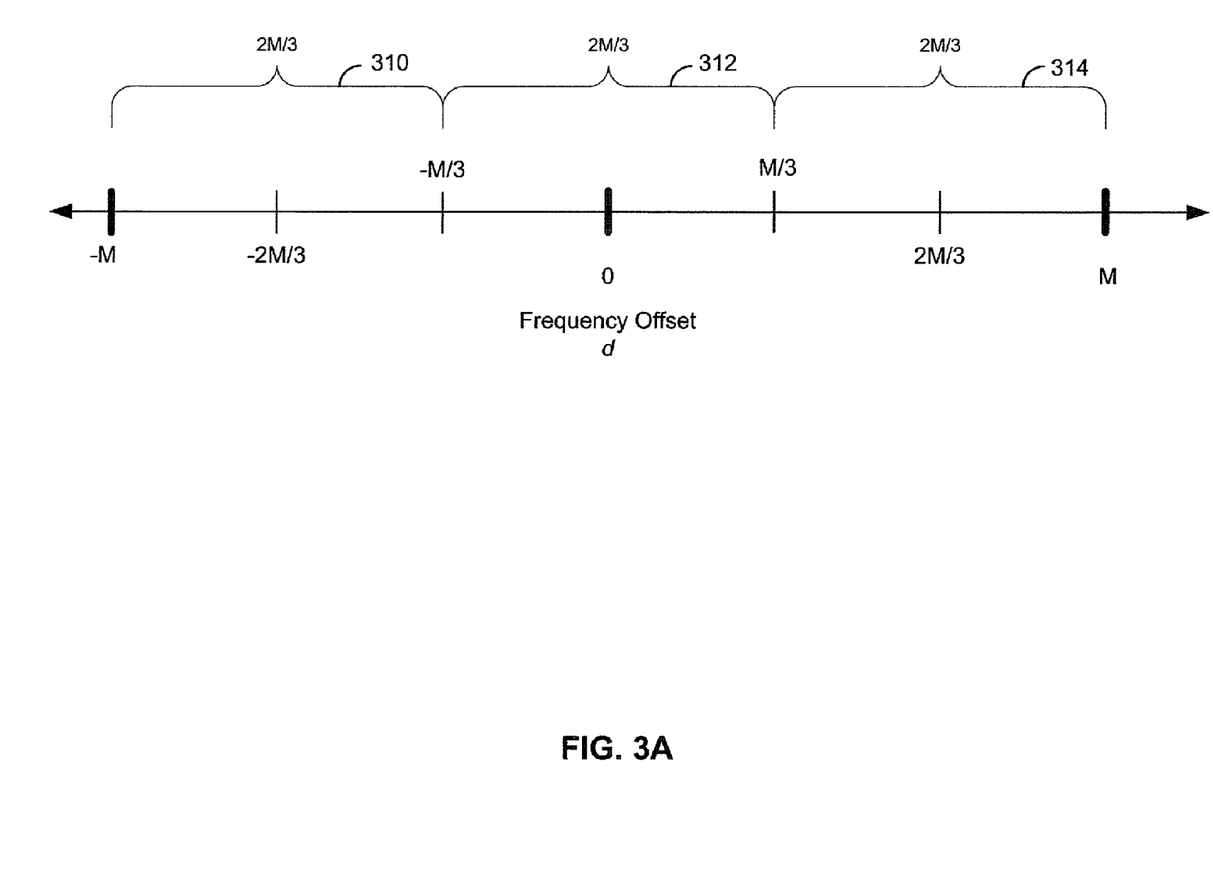
FIG. 3A is a diagram illustrating an exemplary frequency range of hypothesis intervals, in accordance with an embodiment of the invention.

FIG. 3A is a diagram illustrating an exemplary frequency range of hypothesis intervals, in accordance with an embodiment of the invention. Referring to FIG. 3A, there is shown a horizontal frequency offset axis, and 3 exemplary hypothesis test intervals 310, 312, and 314, respectively. There is also shown exemplary frequency offset markings at −M, −2M/3, −M/3, 0, M/3, 2M/3 and M Hz.

Due to the channel characteristics, the accuracy of components employed at the receiver, and/or the system design, it may be known in what range a frequency offset d from a target frequency x may be found. For example, it may be known that a frequency offset may be between a frequency offset d∈{−M, M}. Due to hardware constraints, for example, an exemplary 3 hypotheses may be tested against a received signal at frequency (x+d). In this case, the frequency offset range may be divided into 3 intervals, for example frequency offset intervals 310, 312, and 314. For efficiency reasons, and depending on the statistics of the receiver local oscillator signal frequency offset, equal-length frequency intervals may be utilized, although the invention is not limited in this regard. In instances where three intervals are utilized, as illustrated in FIG. 3A, this may lead to intervals of length 2M/3. It may furthermore be desirable to test for a hypothesis corresponding to a center value of a hypothesis interval. For example, if the frequency offset −d falls into the interval 314, an offset value that may be applied at, for example, a multiplier 202e may be the center value of interval 314, that is s=2M/3, which may lead to a smaller |d−s|, where $$s \in \left\{-\frac{2M}{3}, 0, \frac{2M}{3}\right\},$$

than any other value for s, corresponding to another hypothesis. A smaller value of |d−s| may lead to a larger correlation output at the output of, for example, the PSS correlator 204e, corresponding to the associated frequency offset. Thus, for an exemplary −d in the frequency offset interval 314, an associated correlator may return a larger value, and hence the frequency offset |d−s| may be assumed to be smallest for a chosen offset value s=2M/3.

As may be seen from FIG. 3A, for a given finite frequency offset range of d∈{−M, M}, a higher estimation accuracy of a frequency offset may be achieved by a larger number of hypothesis tests, that is, smaller hypothesis intervals. Since the use of more hypotheses tests may require more hardware, a trade-off between the number of hypotheses (and associated hardware complexity) and the estimation accuracy may have to be made. It may thus be desirable to achieve higher accuracy, without increasing the hypothesis testing hardware.

Higher accuracy, in accordance with various embodiments of the invention, for similar hardware complexity, may be achieved through an iterative process that may successively estimate local oscillator frequency offset, and feed it back to adjust the local oscillator frequency. The multi-frequency hypothesis (MFH) grid that may be illustrated in FIG. 3A, may then be shortened by an exemplary factor of 3, and the residual frequency offset may be re-estimated using the narrower spaced MFH grid. The re-estimation may be based on, for example, the PSS correlation magnitude as an indicator of a desirable estimate of frequency offset. On each successive iteration, the process may be repeated and the frequency offset may be further reduced with the iterative process terminated when the residual frequency offset may be within an acceptable margin of error. In these instances, the accuracy may depend on the number of iterations. In this case, although comparatively little extra hardware may be required, additional processing time may be needed. An iterative process may be achieved, in accordance with various embodiments of the invention, via programmable interval boundaries, and programmable hypothesis tests.

Figure 3B:
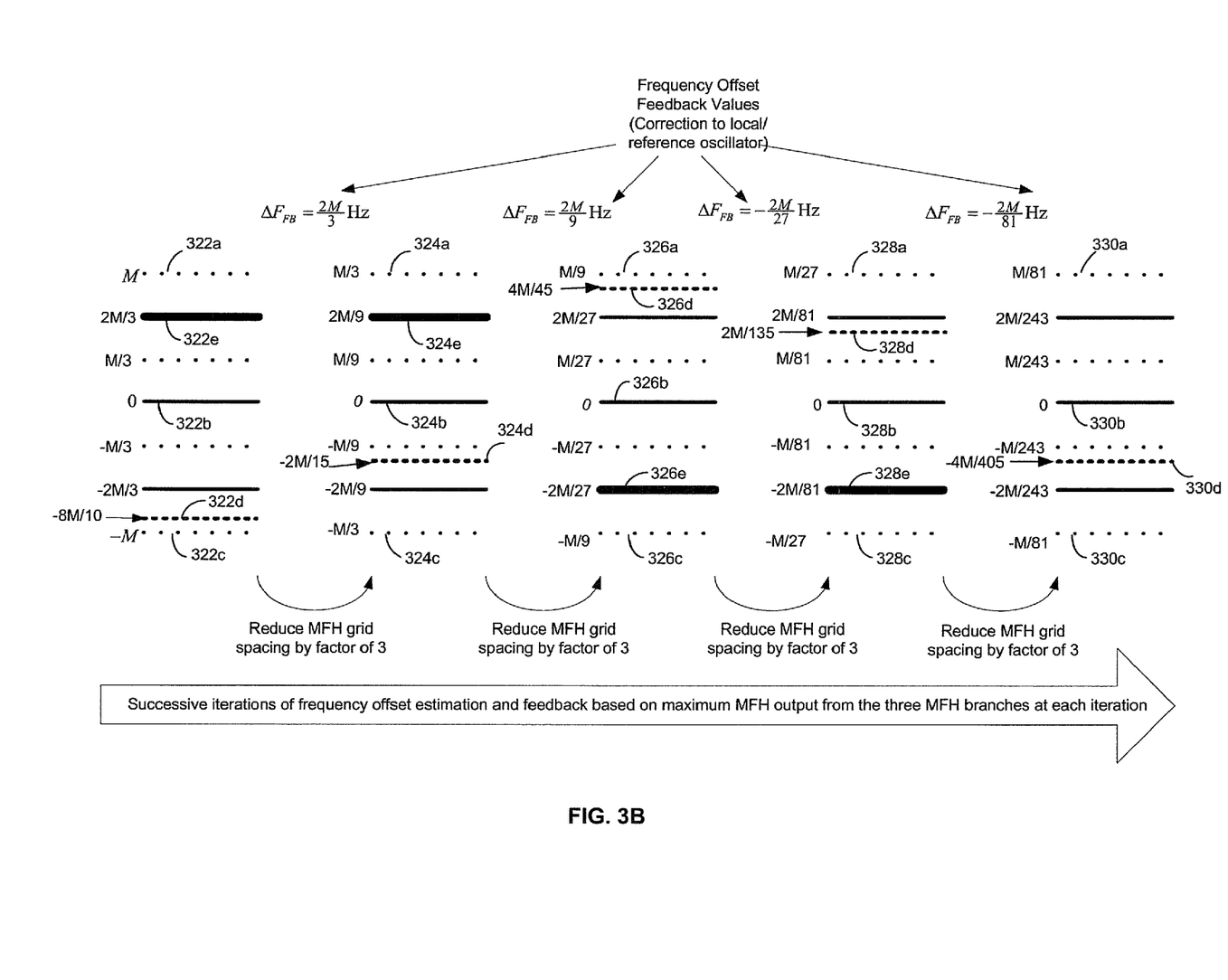
FIG. 3B is a diagram illustrating an exemplary iterative process, in accordance with various embodiments of the invention.

FIG. 3B is a diagram illustrating an exemplary iterative process, in accordance with various embodiments of the invention. Referring to FIG. 3B, an upper relative frequency offset range boundary 322a, 324a, 326a, 328a, and 330a may be illustrated for a first iteration, a second iteration, a third iteration, a fourth iteration, and a fifth iteration, respectively. Similarly, a lower relative frequency offset range boundary 322c, 324c, 326c, 328c, and 330c may be illustrated for a first iteration, a second iteration, a third iteration, a fourth iteration, and a fifth iteration, respectively. Similarly, a center frequency offset 322b, 324b, 326b, 328b, and 330b, between the lower relative frequency offset range boundary and the upper relative frequency offset range boundary may be illustrated for a first iteration, a second iteration, a third iteration, a fourth iteration, and a fifth iteration, respectively. An exemplary residual frequency offset 322d, 324d, 326d, 328d, and 330d from the respective desired local oscillator frequency for a first iteration, second iteration, third iteration, fourth iteration, and fifth iteration, may also be illustrated, with respect to the oscillator frequency at each iteration. A branch may be selected on the basis of greatest correlation magnitude for a first iteration, a second iteration, a third iteration and a fourth iteration respectively, and may be illustrated by 322e, 324e, 326e and 328e.

Each exemplary illustration may be illustrated by a set of frequency range boundaries. For example, the first iteration may be illustrated by an upper frequency offset range boundary 322a at M Hz, a center frequency offset 322b at 0 Hz, and a lower frequency offset range boundary at −M Hz. Similar boundaries, as introduced above, are illustrated for iterations 2 through 5, respectively. There is also shown a feedback correction value $\Delta F_{FB}$ applied to the local oscillator frequency after each iteration.

As in the example illustrated in FIG. 3A above, assume that due to channel conditions and/or for system purposes, it may be known that the frequency offset may be d∈{−M, M}. Furthermore, as illustrated by an initial local oscillator frequency offset 322d, d=−8M/10, i.e. a received signal may be at a frequency (x+d)=x−8M/10, and so a frequency offset estimate s'=8M/10 would perfectly offset d, that is (x+d+s')=x. The branch within the MFH structure providing an advantageous offset correction to this offset may be the one located at an offset frequency of 2M/3, which may produce the greatest PSS correlation magnitude from the set of correlators employed in connection with FIG. 3B, in accordance with various embodiments of the invention. This exemplary selection may be denoted by 322e, in FIG. 3B As illustrated in FIG. 3A, in the first iteration, for an exemplary value of d=−8M/10, the hypothesis of interval 314 may be chosen, and correspondingly, the local oscillator frequency may be corrected by $\Delta F_{FB}$. Thus, as may be seen from FIG. 3A, the center value of interval 314 may be 2M/3, and thus a $\Delta F_{FB}$=2M/3 may be fed back to the local oscillator and result in a new residual local oscillator offset frequency 324d. Thus, an offset value $\Delta F_{FB}$=2M/3 may be applied to the local oscillator frequency. As shown in FIG. 3A, as the appropriate frequency offset after a first iteration is known to be located in hypothesis interval 314, the hypothesis intervals in the second iteration may only need to span the hypothesis interval 314, and may thus be 3 times shorter. In other words, the uncertainty about the remaining frequency offset may be reduced to within a frequency range of interval 314 because it may now be known that the true frequency offset may be located somewhere within the frequency range defined by interval 314.

Hence, the lower relative frequency offset range boundary 324c, as illustrated in FIG. 3A, may be set to −M/3 with respect to the residual local oscillator offset frequency 324b, and the upper frequency offset boundary 324a, may be set to M/3, also with respect to the center frequency 324b. Thus, after a first iteration, an estimate for the appropriate frequency offset to compensate for d=−0.8M is s'[1]=0.666M, and the residual local oscillator offset frequency 324d may be 8M/10-0.6666M=−2M/15. For each further iteration, the range between the upper relative frequency offset boundary and the lower relative frequency offset boundary may similarly be reduced by a factor, given by the number of hypotheses used, three in this exemplary embodiment of the invention discussed, by appropriately adjusting the local oscillator frequency. Thus, for the third iteration, the upper frequency offset boundary 326a may be given by M/9 with respect to the center frequency 326b, while the lower frequency offset boundary 326c may be −M/9 with respect to the center frequency 326b, and the local oscillator frequency may be adjusted by 2M/9, leading to a cumulative local oscillator frequency adjustment, over the successive iterations up to the present iteration of 0+2M/3+2M/9=8M/9, from the initial local oscillator frequency. Hence, the offset of the oscillator frequency from its desired value has been reduced to −8M/10+8M/9=4M/45. Similarly, the further iterations may further reduce the frequency uncertainty, by further reducing the local oscillator frequency offset from the desired local oscillator frequency. After iteration 4, the frequency offset from the desired local oscillator frequency 330b for the 5th iteration may be only −4M/405 offset in this exemplary illustration.

From the exemplary iterations in FIG. 3B, it is thus clear that faster convergence may be achieved with a larger number of hypotheses that may be used, Based on a desired accuracy, the number of iterations may be determined. As shown in FIG. 3A, in instances where the interval 314, for example, may be selected, and an offset frequency of 2M/3 may be used to correct the local oscillator frequency offset, the largest error may be if the actual offset −d may be located at either extreme of the interval 314, that is, at M/3 or at −M/3. In these instances, the error may be half the size of an interval 314, or M/3, as illustrated in FIG. 3A. Thus, for the example shown in FIG. 3B, after the 4th iteration, the local oscillator adaptation over the preceding four iterations may amount to a cumulative correction of 64M/81 to the local oscillator frequency (with respect to the initial frequency 322b) and may be achieved by iteratively adjusting the local oscillator frequency. The exemplary error may be at most M/81, as illustrated by the upper relative frequency range boundary 330a. In a similar manner, a desirable maximum error may be determined, and the number of required iterations may be determined.

Figure 4:
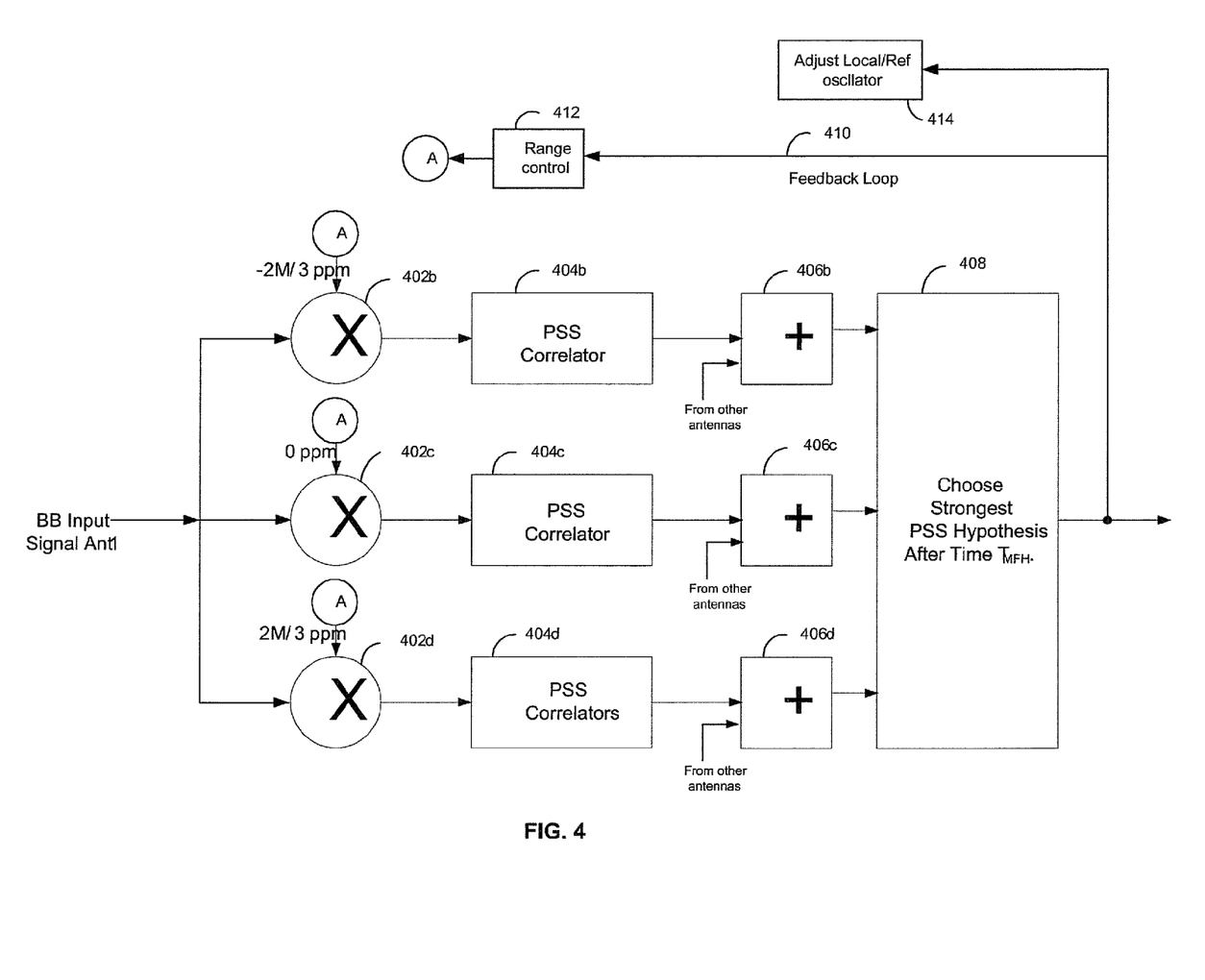
FIG. 4 is a diagram illustrating an exemplary iterative frequency offset hypotheses testing structure, in accordance with various embodiments of the invention.

FIG. 4 is a diagram illustrating an exemplary iterative frequency offset hypotheses testing structure, in accordance with various embodiments of the invention. Referring to FIG. 4, there is shown multipliers 402b, 402c, and 402d, PSS correlators 404b, 404c, and 404d, adders 406b, 406c, and 406d, a selection block 408, a feedback loop 410, a range control 412, and a local oscillator adjustment block 414.

The multipliers 402b, 402c, and 402d may comprise suitable logic, circuitry, interfaces and/or code that may be operable to multiply a plurality of input signals, and generate an output signal that may be proportional to the product of the plurality of input signals.

The PSS correlators 404b, 404c, and 404d may comprise suitable logic, circuitry, interfaces and/or code that may be operable to generate an output signal that may be a correlation between one or more input signals and one or more primary synchronization signals.

The adders 406b, 406c, and 406d may comprise suitable logic, circuitry, interfaces and/or code that may be operable to generate an output signal that may be proportional to the sum of a plurality of input signals. In accordance with various embodiments of the invention, the adders 406b, 406c, and 406d may comprise inputs from a plurality of antennas.

The selection block 408 may comprise suitable logic, circuitry, interfaces and/or code that may be operable to generate an output signal that may correspond to one of a plurality of input signals, based on a decision metric computed from the plurality of input signals.

The range control 412 may comprise suitable logic, circuitry, interfaces and/or code that may be operable to adjust offset frequencies at the multipliers 402b, 402c, and 402d as a function of time/iterations, and the output received from the selection block 408.

The local oscillator adjustment block 414 may comprise suitable logic, circuitry, interfaces and/or code that may be operable to adjust the local oscillator frequency, for example via the range control 412, in accordance with various embodiments of the invention.

As illustrated in FIG. 3B, hypothesis testing may be achieved via multiple iterations of a multi-hypotheses test. As illustrated, in accordance with various embodiments of the invention, an exemplary 3-hypotheses test with multiple iterations may achieve relatively fast convergence. One embodiment of the invention with a 3-hypotheses test and feedback operable for an iterative operation is illustrated in FIG. 4. Functionally, the multipliers 402b, 402c, and 402d, the PSS correlators 404b, 404c, and 404d, the adders 406b, 406c, and 406d and the selector block 408 may be similar to the equivalent blocks in FIG. 2. In particular, a received BB input signal ant 1 may be offset by different frequencies in the multipliers 402b, 402c, and 402d. The output signals of the multipliers 402b, 402c, and 402d may be communicated to the PSS correlators 404b, 404c, and 404d, respectively. The correlation between the output signals from the multipliers 402b, 402c, and 402d may be higher, if the difference between the offset –d and the applied offset s at the multiplier 402b, 402c, and 402d may be close to zero, that is, if |d+s| is low, the correlation at the output of a PSS correlator may be larger. Thus, based on the correlation output at the PSS correlator 404b, 404c, and 404d, and, in instances of multiple antenna systems, the PSS correlators associated with other antennas, combined in the adders 406b, 406c, and 406d, the selector block 408 may estimate which of the frequency offsets applied at the multipliers 402b, 402c, and 402d may best compensate for the offset d in the received BB input signal ant 1. The decision of the selector block 408 may then be fed back to the range control 412 and/or the local oscillator adjustment block 414, which may adjust the frequency offsets at the multipliers 402b, 402c, and 402d and/or the local oscillator, as described in detail with respect to FIG. 3B.

For example, as illustrated in FIG. 3A, FIG. 3B and FIG. 4, an initial frequency offset at the multipliers 402b, 402c, and 402d may be –2M/3, 0, and 2M/3 Hz, for example, in accordance with the example in FIG. 3B. For the exemplary iteration described in FIG. 3B, for the second iteration shown in FIG. 3B, the frequencies for the multipliers 402b, 402c, and 402d may be set by the range control 412 to –2M/9, 0, 2M/9 and/or the local oscillator adjustment block 414, respectively, in accordance with the exemplary description set forth for FIG. 3B. Similarly, the frequency offsets of the multipliers 402b, 402c, and 402d may be adjusted based on the selector outputs during further iterations. Once a certain accuracy has been reached, for example in instances when the maximum error is below a certain threshold, as described with respect to FIG. 3B, the iterative process may be terminated.

Figure 5:
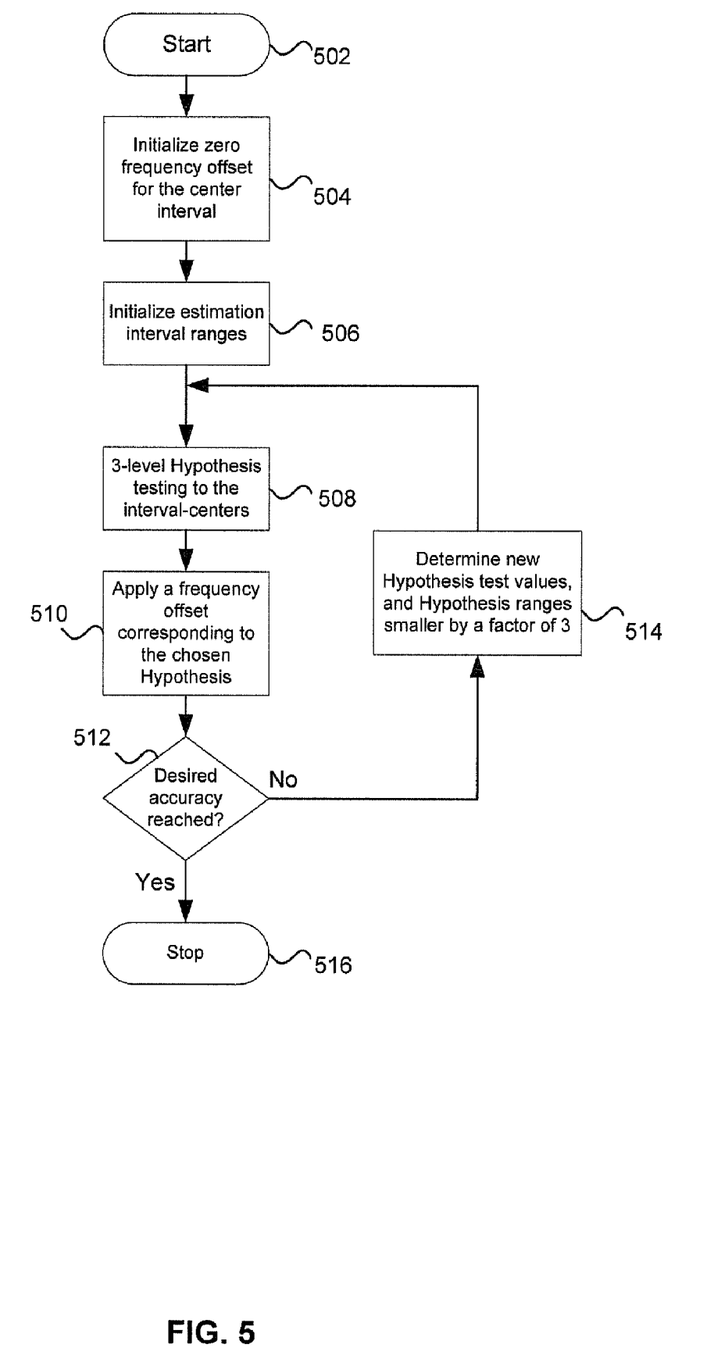
FIG. 5 is a flow chart illustrating exemplary multi-hypotheses frequency offset testing, in accordance with various embodiments of the invention.

FIG. 5 is a flow chart illustrating exemplary multi-hypotheses frequency offset testing, in accordance with various embodiments of the invention. Referring to FIG. 5, a frequency offset estimation process may be commenced. In step 504 and step 506, a zero frequency offset may initially be set at a center frequency multiplier, for example the multiplier 402c, which may be controlled by the range control 412. Similarly, for a first iteration it may be desirable to set the frequency offsets at other multipliers so as to span the entire range within which the frequency offset –d is expected. For example, as explained with respect to FIG. 3B and FIG. 4, the multipliers 402b and 402d may be set to frequency offsets of –2M/3 and 2M/3, respectively, to cover an initial frequency offset range of d∈{–M, M} Hz, corresponding to the initial situation depicted in FIG. 3B, for example. As described in FIG. 4, the frequency offsets applied, for example, through the multipliers 402b, 402c, and 402d may be adjusted adaptively, and dynamically at each iteration, as may be necessary.

In step 508, a 3-level hypotheses test may be performed, as described for FIG. 3B. This may be achieved, by estimating a frequency offset from the output of the PSS correlators and feeding back the estimated offset as a correction to the local oscillator frequency. In step 510, the local oscillator frequency is adapted, for example, via the local oscillator frequency adjustment block 414 and/or the range control 412. In step 508, the various inputs to the selector block 408 from the PSS correlators, for example, may be compared, and a frequency offset may be selected, which may correspond to a desirable frequency offset hypothesis. In most instances, the correlator with the greatest output magnitude may correspond to the best frequency offset compensation within the range spanned by the MFH structure at a particular iteration. Based on the decision taken by the selector block 408, the range control 412, for example, may apply the selected frequency offset estimate to the local oscillator frequency in step 510, and reprogram suitable frequency offsets at the multipliers 402b, 402c, and 402d, in step 514. In step 512, if a desired accuracy has been reached, based primarily on, for example, the number of iterations, and the number of hypothesis branches (for example three, as illustrated in FIG. 3B and FIG. 4), the iterative local oscillator frequency offset adaptation process may terminate in step 516. Alternatively, if the desired accuracy has not been reached, in step 512, new hypothesis ranges, new frequency offsets at the multipliers 402b, 402c, and 402d, for example, may be set appropriately. For example, for 3 hypothesis branches as illustrated in FIG. 4, the hypothesis ranges will be divided by a factor of three, for each iteration. Thus, if the desired accuracy has not been reached yet, from step 514, the process will continue in step 508.

In accordance with an embodiment of the invention, a method and system for reducing the complexity of multi-frequency hypothesis testing using an iterative approach may comprise estimating a frequency offset of a receiver local oscillator/reference oscillator signal frequency via a plurality of iterative frequency offset hypotheses tests, as described in FIG. 3A to FIG. 5. The iterative frequency offset hypotheses may be adjusted for each iteration, for example via the range control 412. A correlation may be done between a primary synchronization signal (PSS), and one or more frequency offset versions of a received signal to control the adjustment of the iterative frequency offset hypotheses, as described in FIG. 3B, for example. A frequency of the receiver local oscillator signal may be adjusted, for example via the local oscillator adjustment block 414 based on the estimated frequency offset.

One or more frequency offset versions of the received signal may be generated via one or more multiplication operations, which may be achieved via a multiplication signal corresponding to one or more frequency offsets, which are generated by, for example, the multipliers 402b, 402c, and 402d. The frequency offset of the receiver local oscillator/reference oscillator signal may be estimated from the correlation magnitude, for example, by the PSS correlators 404b, 404c, and 404d. The frequency offset of the received signal may be estimated by comparing the correlations between the primary synchronization signal and the one or more frequency offset version of the received signal in the selection block 408, for example. The frequency offset range for each iteration may be adjusted in the range control 412 for the frequency offset hypotheses by a factor equal to the number of the frequency offset hypotheses, as illustrated with respect to FIG. 3B. One or more offset frequencies for generating the one or more frequency offset versions of the received signal may be selected by choosing the one or more offset frequencies to be a center frequency of a frequency offset range associated with the frequency offset hypotheses, as discussed in FIG. 3A, and FIG. 3B. The primary synchronization signal, as used in the PSS correlators 404b, 404c, and 404d, for example, may be compliant with, for example, the UMTS or E-UTRA(LTE) standards. The received signal may be received via multiple antennas, and the correlated signals may be combined with one or more correlated signals associated with one or more of the multiple antennas.

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for reducing the complexity of multi-frequency hypothesis testing using an iterative approach.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing communication signals in a wireless communication device, comprising:
   multiplying, by the wireless communication device, a received communication signal with a plurality of iterative frequency offset hypotheses tests to provide a plurality of frequency offset hypotheses, the plurality of iterative frequency offsets corresponding to a plurality of frequency offsets;
   correlating, by the wireless communication device, a primary synchronization signal (PSS) and each of the plurality of frequency offset hypotheses to provide a plurality of PSS hypotheses; and
   adjusting, by the wireless communication device, a frequency of a receiver local oscillator signal using a corresponding frequency offset from among the plurality of frequency offsets that corresponds to one of the plurality of PSS hypotheses having a highest correlation.

2. The method of claim 1, further comprising:
   iteratively repeating the steps of multiplying, correlating, and adjusting by varying the plurality of iterative frequency offset hypotheses tests until a residual frequency offset of the receiver local oscillator signal is within an acceptable margin of error.

3. The method of claim 2, further comprising:
   determining a difference between an actual frequency of the receiver local oscillator signal and a desired frequency of the receiver local oscillator signal to provide the residual frequency offset.

4. The method of claim 2, wherein the step of multiplying comprises:
   multiplying the received communication signal with the plurality of iterative frequency offset hypotheses tests to provide the plurality of frequency offset hypotheses within a first range, and wherein the step of iteratively repeating comprises:
   varying the plurality of iterative frequency offset hypotheses tests such that the plurality of frequency offset hypotheses are within a second range, the second range being a subset of the first range.

5. The method of claim 1, further comprising:
   multiplying the received communication signal with a second plurality of iterative frequency offset hypotheses tests to provide a second plurality of frequency offset hypotheses;
   correlating the PSS and each of the second plurality of frequency offset hypotheses to provide a second plurality of PSS hypotheses; and
   combining the second plurality of PSS hypotheses with a corresponding PSS hypothesis from among the plurality of PSS hypotheses to provide a plurality of combined PSS hypotheses, and
   wherein the step of adjusting comprises:
   adjusting the frequency of the receiver local oscillator signal using the corresponding frequency offset from among the plurality of frequency offsets that corresponds to one of the plurality of combined PSS hypotheses having a highest correlation.

6. The method of claim 5, further comprising:
   receiving the received communication signal using a plurality of antennas,
   wherein the step of multiplying the received communication signal with the plurality of iterative frequency offset hypotheses tests comprises:
   multiplying the received communication signal as received by a first antenna from among the plurality of antennas with the plurality of iterative frequency offset hypotheses tests, and
   wherein the step of multiplying the received communication signal with the second plurality of iterative frequency offset hypotheses tests comprises:
   multiplying the received communication signal as received by a second antenna from among the plurality of antennas with the second plurality of iterative frequency offset hypotheses tests.

7. An apparatus for processing communication signals in a wireless communication device, comprising:
   a plurality of multipliers configured to multiply a received communication signal with a plurality of iterative frequency offset hypotheses tests to provide a plurality of frequency offset hypotheses, the plurality of iterative frequency offset offsets corresponding to a plurality of frequency offsets;
   a plurality of correlators configured to correlate a primary synchronization signal (PSS) and each of the plurality of frequency offset hypotheses to provide a plurality of PSS hypotheses; and a selector block configured to adjust a receiver local oscillator signal using a corresponding frequency offset from among the plurality of frequency offsets that corresponds to one of the plurality of PSS hypotheses having a highest correlation.

8. The apparatus of claim 7, further comprising:
a range control module configured to vary the plurality of iterative frequency offset hypotheses tests until a residual frequency offset of the receiver local oscillator signal is within an acceptable margin of error.

9. The apparatus of claim 8, wherein the range control module is further configured to determine a difference between an actual frequency of the receiver local oscillator signal and a desired frequency of the receiver local oscillator signal to provide the residual frequency offset.

10. The apparatus of claim 8, wherein the plurality of multipliers are further configured to multiply the received communication signal with the plurality of iterative frequency offset hypotheses tests to provide the plurality of frequency offset hypotheses within a first range, and
wherein the range control module is further configured to vary the plurality of iterative frequency offset hypotheses tests such that the plurality of frequency offset hypotheses are within a second range, the second range being a subset of the first range.

11. The apparatus of claim 7, further comprising:
a second plurality of multipliers configured to multiply the received communication signal with a second plurality of iterative frequency offset hypotheses tests to provide a second plurality of frequency offset hypotheses;
a plurality of correlators configured to correlate the PSS and each of the second plurality of frequency offset hypotheses to provide a second plurality of PSS hypotheses; and
a plurality of adders configured to combine the second plurality of PSS hypotheses with a corresponding PSS hypothesis from among the plurality of PSS hypotheses to provide a plurality of combined PSS hypotheses,
wherein the range control module is further configured to adjust the frequency of the receiver local oscillator signal using the corresponding frequency offset from among the plurality of frequency offsets that corresponds to one of the plurality of combined PSS hypotheses having a highest correlation.

12. The apparatus of claim 11, further comprising:
a plurality of antennas configured to receive the received communication signal,
wherein the plurality of multipliers are configured to multiply the received communication signal as received by a first antenna from among the plurality of antennas with the plurality of iterative frequency offset hypotheses tests, and
wherein the second plurality of multipliers are configured to multiply the received communication signal as received by a second antenna from among the plurality of antennas with the second plurality of iterative frequency offset hypotheses tests.

13. An apparatus for processing communication signals in a wireless communication device, comprising:
a plurality of multipliers configured to multiply a received communication signal with a plurality of iterative frequency offset hypotheses tests to provide a plurality of frequency offset hypotheses, the plurality of iterative frequency offset offsets corresponding to a plurality of frequency offsets;
a plurality of correlators configured to correlate a reference signal and each of the plurality of frequency offset hypotheses to provide a plurality of hypotheses; and
a selector block configured to adjust a receiver local oscillator signal using a corresponding frequency offset from among the plurality of frequency offsets that corresponds to one of the plurality of hypotheses having a highest correlation.

14. The apparatus of claim 13, wherein the reference signal is a primary synchronization signal (PSS).

15. The apparatus of claim 13, further comprising:
a range control module configured to vary the plurality of iterative frequency offset hypotheses tests until a residual frequency offset of the receiver local oscillator signal is within an acceptable margin of error.

16. The apparatus of claim 15, wherein the range control module is further configured to determine a difference between an actual frequency of the receiver local oscillator signal and a desired frequency of the receiver local oscillator signal to provide the residual frequency offset.

17. The apparatus of claim 15, wherein the plurality of multipliers are further configured to multiply the received communication signal with the plurality of iterative frequency offset hypotheses tests to provide the plurality of frequency offset hypotheses within a first range, and
wherein the range control module is further configured to vary the plurality of iterative frequency offset hypotheses tests such that the plurality of frequency offset hypotheses are within a second range, the second range being a subset of the first range.

18. The apparatus of claim 15, further comprising:
a second plurality of multipliers configured to multiply the received communication signal with a second plurality of iterative frequency offset hypotheses tests to provide a second plurality of frequency offset hypotheses;
a plurality of correlators configured to correlate the PSS and each of the second plurality of frequency offset hypotheses to provide a second plurality of PSS hypotheses; and
a plurality of adders configured to combine the second plurality of PSS hypotheses with a corresponding PSS hypothesis from among the plurality of PSS hypotheses to provide a plurality of combined PSS hypotheses,
wherein the range control module is further configured to adjust the frequency of the receiver local oscillator signal using the corresponding frequency offset from among the plurality of frequency offsets that corresponds to one of the plurality of combined PSS hypotheses having a highest correlation.

19. The apparatus of claim 18, further comprising:
a plurality of antennas configured to receive the received communication signal,
wherein the plurality of multipliers are configured to multiply the received communication signal as received by a first antenna from among the plurality of antennas with the plurality of iterative frequency offset hypotheses tests, and
wherein the second plurality of multipliers are configured to multiply the received communication signal as received by a second antenna from among the plurality of antennas with the second plurality of iterative frequency offset hypotheses tests.

* * * * *

UNITED STATES PATENT AND TRADEMARK OFFICE
CERTIFICATE OF CORRECTION

PATENT NO.        : 8,380,151 B2
APPLICATION NO.   : 12/721979
DATED             : February 19, 2013
INVENTOR(S)       : Swarts et al.

Page 1 of 1

It is certified that error appears in the above-identified patent and that said Letters Patent is hereby corrected as shown below:

Title Page, Item (57), Abstract, line 12, please replace "offset version" with -- offset versions --.

In the Claims

Column 13, line 54, please replace "offsets" with -- offset hypotheses tests --.

Column 14, line 62, please replace "offset offsets" with -- offset hypotheses tests --.

Column 16, line 1, please replace "offset offsets" with -- offset hypotheses tests --.

Signed and Sealed this
Twenty-first Day of May, 2013

Teresa Stanek Rea
*Acting Director of the United States Patent and Trademark Office*